US011348621B2

(12) United States Patent
Yadav et al.

(10) Patent No.: US 11,348,621 B2
(45) Date of Patent: May 31, 2022

(54) LOW-GLITCH SWITCH CONTROL FOR MODE SWITCHING OF MEMORY CELLS

(71) Applicant: QUALCOMM Incorporated, San Diego, CA (US)

(72) Inventors: Kshitij Yadav, San Diego, CA (US); Vijayakumar Dhanasekaran, San Diego, CA (US); Yan Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 34 days.

(21) Appl. No.: 17/000,163

(22) Filed: Aug. 21, 2020

(65) Prior Publication Data

US 2022/0059138 A1    Feb. 24, 2022

(51) Int. Cl.
  *G11C 5/14*       (2006.01)
  *H03K 19/20*      (2006.01)

(52) U.S. Cl.
  CPC ............ *G11C 5/147* (2013.01); *H03K 19/20* (2013.01)

(58) Field of Classification Search
  CPC .............................. G11C 5/147; H03K 19/20
  USPC ...................................................... 365/226
  See application file for complete search history.

(56) References Cited

U.S. PATENT DOCUMENTS

| 2007/0081392 | A1 | 4/2007 | Park et al. |
| 2012/0013314 | A1 | 1/2012 | Tanzawa |
| 2014/0077781 | A1 | 3/2014 | Murakami et al. |
| 2014/0307515 | A1* | 10/2014 | Bonet Zordan ...... G11C 29/021 365/201 |
| 2020/0363850 | A1* | 11/2020 | Lee ........................ G05F 1/66 |

OTHER PUBLICATIONS

International Search Report and Written Opinion—PCT/US2021/045699—ISA/EPO—dated Nov. 30, 2021.

\* cited by examiner

*Primary Examiner* — Huan Hoang
(74) *Attorney, Agent, or Firm* — Loza & Loza, LLP

(57) ABSTRACT

An apparatus for power supply mode switching includes a first voltage regulator to output a first voltage, a second voltage regulator to output a second voltage, a third voltage regulator to output a third voltage, an electronic load, a first switch between the first voltage regulator and the electronic load, a second switch between the second voltage regulator and the electronic load, and a third switch between the third voltage regulator and the electronic load. And, a method for power supply mode switching includes supplying power to an electronic load with a first voltage; switching to a second voltage; maintaining coupling of the electronic load with the second voltage while a voltage across the electronic load is less than a reference voltage; and switching to a third voltage when the voltage is greater than or equal to the reference voltage and the third voltage is less than the second voltage.

37 Claims, 5 Drawing Sheets

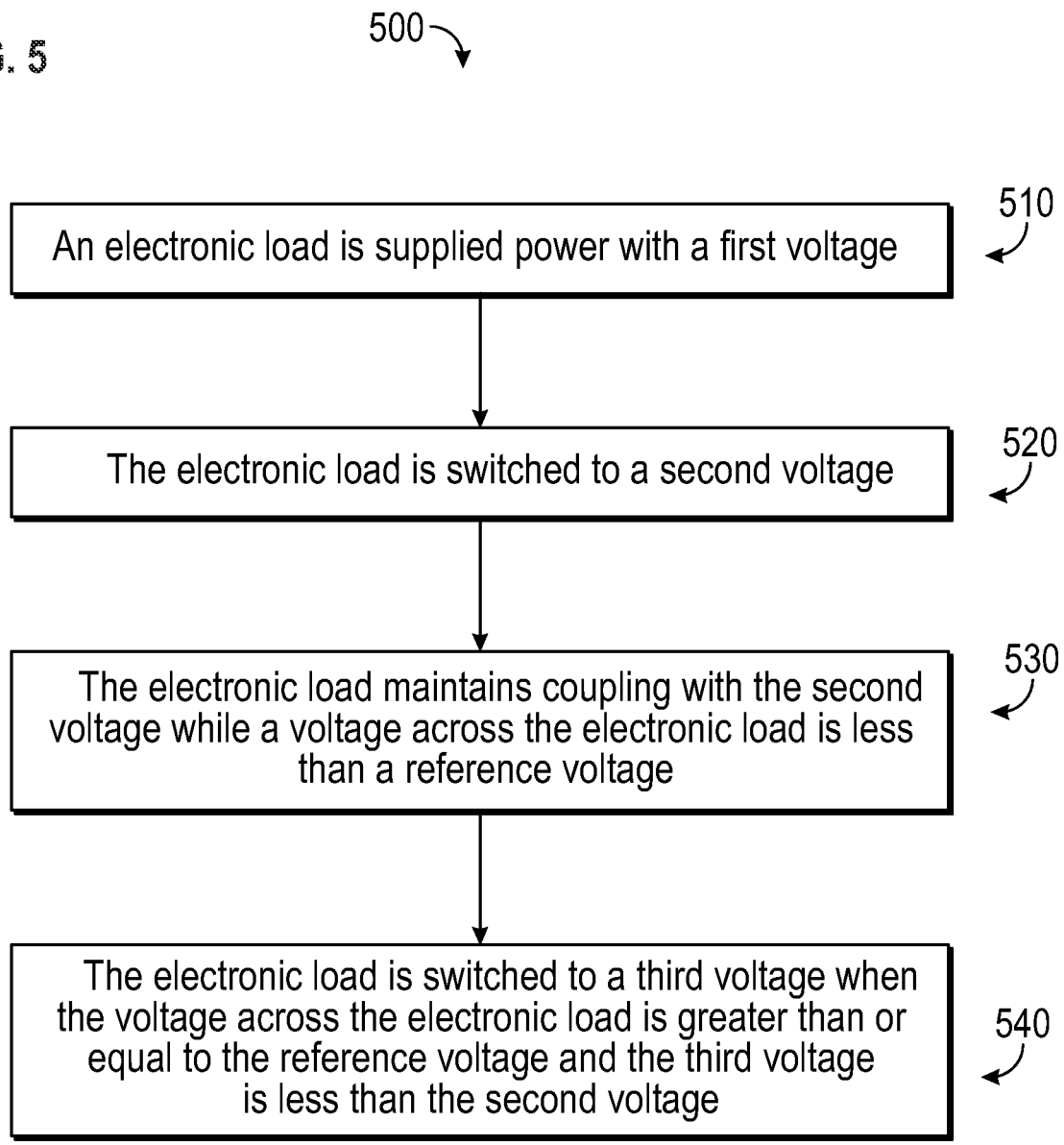

LOW-GLITCH SWITCH CONTROL FOR MODE SWITCHING OF MEMORY CELLS

TECHNICAL FIELD

This disclosure relates generally to the field of power distribution, and, in particular, to a low-glitch switch control for mode switching of memory cells.

BACKGROUND

Electronic systems, for example, computing systems, include a memory system to retain data and logic information over an indefinite time duration. Typically, the memory system is architected as a plurality of memory units which may be independently controlled, for example, into a plurality of memory states. In one example, several memory units share a common power supply with a plurality of voltage lines where a memory state transition in one or more of the memory units induces a voltage transient (e.g., a glitch) in an operational power bus. For example, the voltage transient may cause faulty operation in some of the memory units connected to the operational power bus. One way of mitigating the voltage transient is increasing an operational power supply bandwidth to reduce a transient amplitude of an operational voltage. However, such bandwidth increase has the disadvantage of increasing dc power consumption and may result in a dc current consumption overhead of many hundreds of microamperes.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides switch control. Accordingly, an apparatus for power supply mode switching including a first voltage regulator configured to output a first voltage; a second voltage regulator configured to output a second voltage; a third voltage regulator configured to output a third voltage; an electronic load; a first switch between the first voltage regulator and the electronic load; a second switch between the second voltage regulator and the electronic load; and a third switch between the third voltage regulator and the electronic load.

In one example, the second switch is configured to electrically couple the second voltage regulator to the electronic load when a voltage across the electronic load is less than a reference voltage. In one example, the second switch is configured to electrically couple the second voltage regulator to the electronic load when the first switch is configured to electrically decouple from the electronic load. In one example, the third switch is configured to electrically couple the third voltage regulator to the electronic load when the voltage across the electronic load is greater than or equal to the reference voltage. In one example, the third switch is configured to electrically couple the third voltage regulator to the electronic load when the second switch is configured to electrically decouple from the electronic load.

In one example, the first voltage is less than the second voltage. In one example, the first voltage is less than the third voltage and less than the reference voltage. In one example, the first voltage regulator and the third voltage regulator are supplied by a common power source. In one example, the first voltage regulator and the third voltage regulator are supplied by a first power source different than a second power source supplying the second voltage regulator.

In one example, the electronic load includes a plurality of memory units. In one example, a memory state of each of the plurality of memory units is independent of the memory state of another of the plurality of memory units. In one example, the memory state includes at least one of a retention memory state and an operational memory state. In one example, the first voltage is used for the retention memory state and the third voltage is used for the operational memory state. In one example, the first voltage is used for a retention memory state and the third voltage is used for an operational memory state of the electronic load.

In one example, the apparatus further includes a logic circuit configured to electrically couple to the electronic load and to the first voltage regulator when the first switch is enabled, configured to electrically couple to the second voltage regulator when the second switch is enabled, or configured to electrically couple to the third voltage regulator when the third switch is enabled.

In one example, the logic circuit includes a comparator and a flip flop coupled to the comparator. In one example, the logic circuit further includes a combinational logic circuit. In one example, the combinational logic circuit includes a first inverter and a second inverter; and an AND gate with a first input and a second input, wherein the first input is coupled to the first inverter and the second input is coupled to the second inverter. In one example, the electronic load is at least one of the following: a memory unit, a processor, a combinational logic, a dynamic logic, or a sequential logic.

Another aspect of the disclosure provides a method for power supply mode switching, including supplying power to an electronic load with a first voltage; switching to a second voltage; maintaining coupling of the electronic load with the second voltage while a voltage across the electronic load is less than a reference voltage; and switching to a third voltage when the voltage across the electronic load is greater than or equal to the reference voltage and wherein the third voltage is less than the second voltage.

In one example, the switching to the second voltage occurs when the electronic load starts its transition from a first memory state to a second memory state. In one example, the first memory state is a retention memory state, and the second memory state is an operational memory state. In one example, the method further includes supplying power to the electronic load with the second voltage while the voltage across the electronic load is increasing and is less than the reference voltage. In one example, the method further includes supplying power to the electronic load with the second voltage while the voltage across the electronic load is less than the reference voltage.

In one example, the first voltage is less than the second voltage. In one example, the first voltage is less than the third voltage and less than the reference voltage. In one example, the first voltage is used for a retention memory state of the electronic load and the third voltage is used for an operational memory state of the electronic load. In one example, the first voltage and the third voltage are supplied by a power supply. In one example, the power supply does not supply the second voltage. In one example, the power supply supplies the second voltage. In one example, the electronic load includes a plurality of memory units.

In one example, a memory state of each of the plurality of memory units is independent of the memory state of another of the plurality of memory units. In one example, the memory state is a retention memory state or an operational memory state. In one example, the switching to the second voltage is triggered by a change of the memory state of at least one of the plurality of memory units. In one example, the switching to the second voltage is triggered by a transition of a memory state of the electronic load. In one example, the memory state transitions from a retention memory state to an operational memory state.

Another aspect of the disclosure provides an apparatus for power supply mode switching, including means for supplying power to an electronic load with a first voltage; means for switching to a second voltage; means for maintaining coupling of the electronic load with the second voltage while a voltage across the electronic load is less than a reference voltage; and means for switching to a third voltage when the-voltage across the electronic load is greater than or equal to the reference voltage and wherein the third voltage is less than the second voltage. In one example, the first voltage is less than the second voltage, and wherein the first voltage is less than the third voltage and less than the reference voltage.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

FIG. 5 illustrates an example flow diagram for power supply mode switching.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

In one example, a memory system in an electronic system is an information storage system which retains data and logic information over time. The retention of data and logic information allows the electronic system to access data and logic information across an indefinite time duration. For example, access may be a read operation (i.e., retrieving previously saved data) or a write operation (i.e., storing updated data).

The memory system, for example, may include a plurality of memory units. Each memory unit may have a plurality of memory devices (e.g., memory cells) and may be controlled by a memory controller. In one example, the memory controller manages the memory state for each memory unit. For example, the memory state may be operational memory state, retention memory state, off memory state, etc. In one example, the memory state is a mode of the memory devices.

Figure 1:
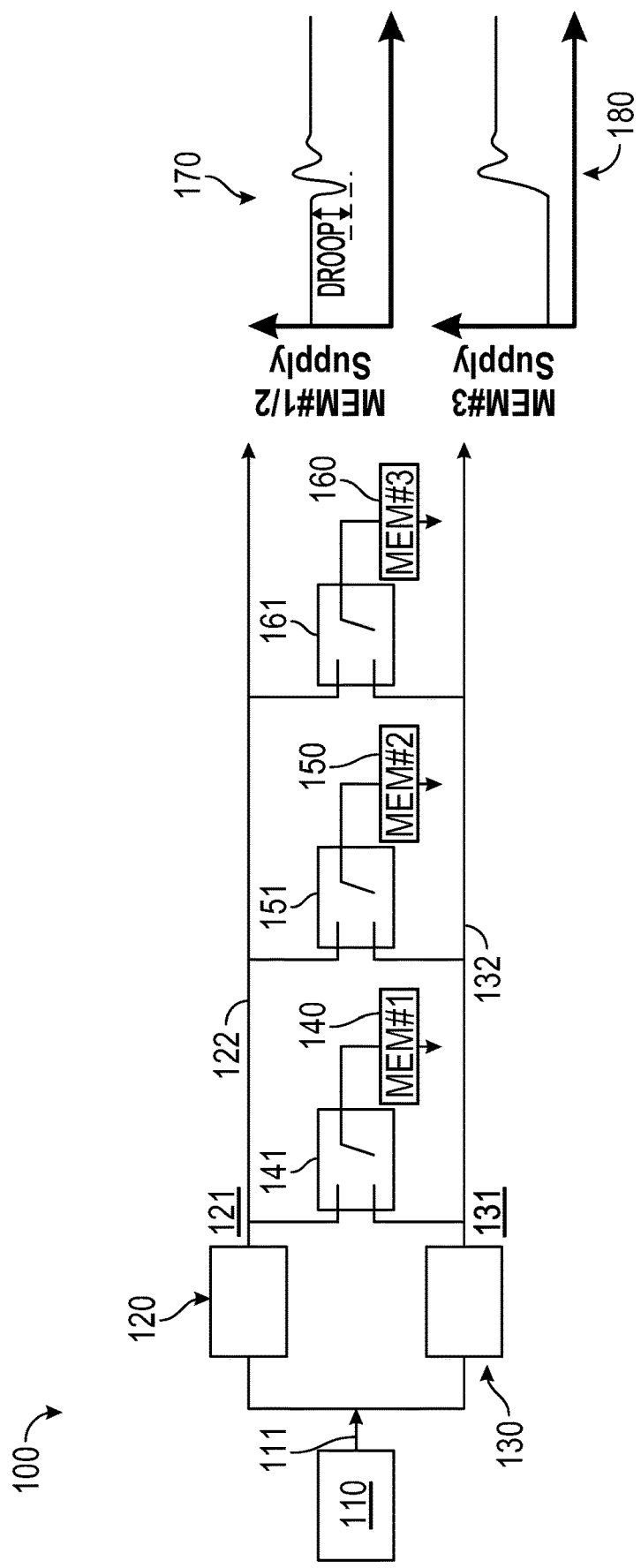
FIG. 1 illustrates a first example power distribution network for a memory system.

FIG. 1 illustrates a first example power distribution network 100 for a memory system. For example, a primary power supply 110 provides a primary voltage 111 to two secondary power supplies: an operational power supply 120 and a retention power supply 130. For example, the operational power supply 120 provides an operational voltage 121 on an operational power bus 122. For example, the retention power supply 130 provides a retention voltage 131 on a retention power bus 132.

Also shown in FIG. 1 are a plurality of electronic loads connected to either the operational power bus 122 or the retention power bus 132 via a bus select switch. For example, the electronic loads may include a first memory unit 140 with a first bus select switch 141, a second memory unit 150 with a second bus select switch 151, a third memory unit 160 with a third bus select switch 161, etc. In one example, each of the bus select switches (141, 151, 161, etc.) may connect each memory unit (140, 150, 160, etc.) to either the operational power bus 122 or the retention power bus 132. For example, the operational power bus 122 may be selected when a memory unit is in an operational memory state and the retention power bus 132 may be selected when the memory unit is in a retention memory state.

In one example, the operational memory state is used when the memory unit is in a fully operational memory state wherein all functions are enabled. In one example, the retention memory state is used when the memory unit is in a state where there are no accesses to the memory unit, also known as a sleep memory state, but data and logic information stored in the memory unit needs to be retained. For example, the retention memory state consumes less electrical power than the operational memory state.

In one example, when a plurality of memory units share a same power supply, if one or more of the memory units changes from the retention memory state to the operational memory state, a voltage transient (e.g., voltage droop) on the operational power bus 122 may be induced and may have a voltage amplitude large enough to cause faulty or undesired operation of other memory units connected to the operational power bus 122. For example, the induced voltage transient may be partially mitigated by increasing the bandwidth of the operational power supply 120. However, the increased bandwidth may require excessive DC power consumption and a high DC current consumption overhead, for example, of hundreds of microamperes.

In one example, the primary voltage 111 may be externally supplied, may be supplied from a switching regulator (external or internal to the power distribution network 100), or may be supplied from an internal low dropout regulator. FIG. 1 also illustrates two example graphs 170, 180 of power supply voltages where a first memory unit transitions from a retention memory state to an operational memory state and a second memory unit is subject to an undesired voltage transient during this transition on the first memory unit. Graph 170 shows voltage inputted to the second memory unit, and graph 180 shows voltage inputted to the first memory unit.

An example technique in mitigating the induced voltage transient is a power distribution network where DC current sinking on the operational power bus is maintained while transitioning from the retention memory state to the operational memory state. In one example, this power distribution network may result in a slight voltage overshoot, rather than a voltage undershoot, on the operational power bus, which may be more compatible with a variety of electronic loads, such as digital signal processing logic, memory, etc.

Figure 2:
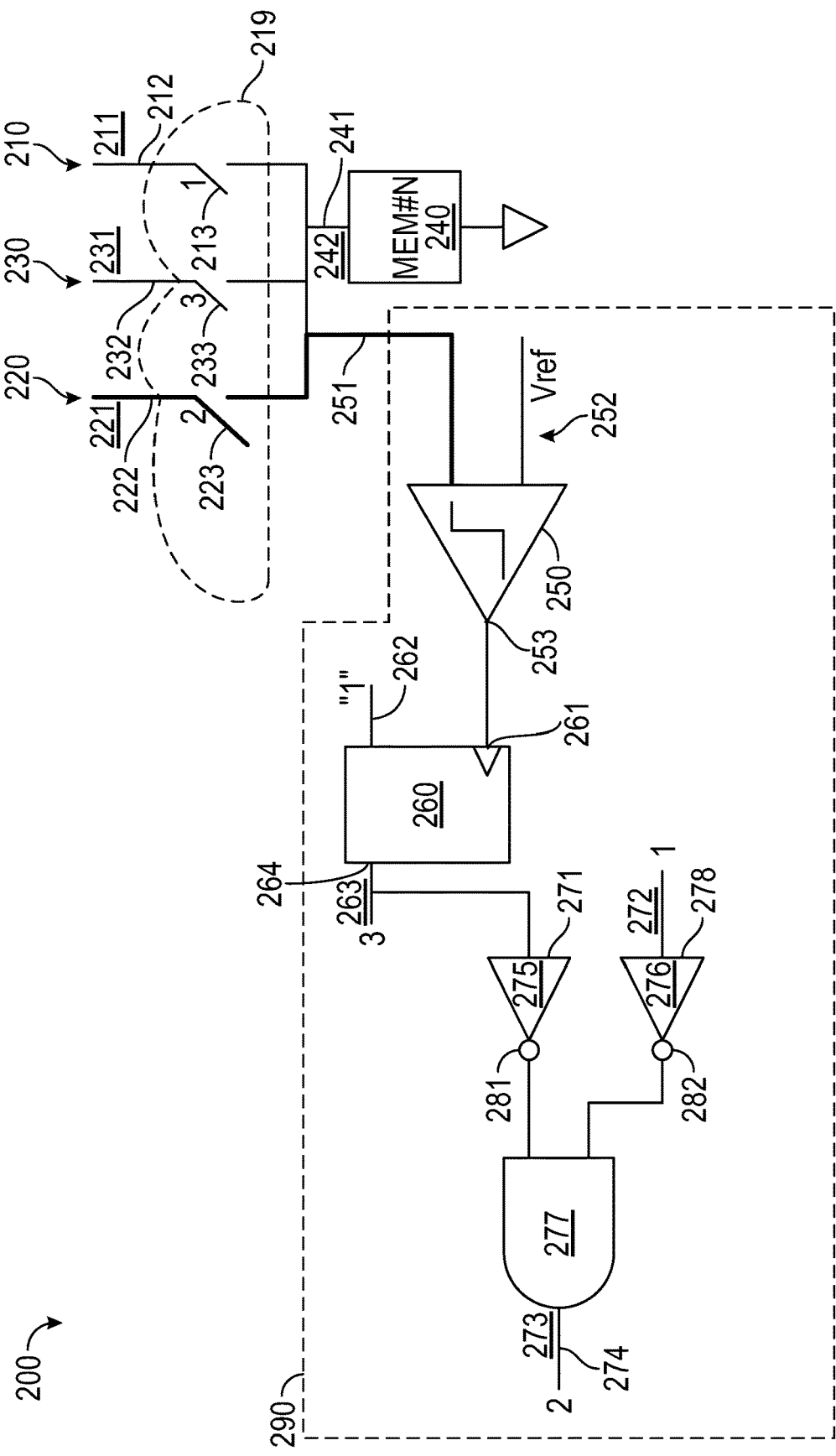
FIG. 2 illustrates a second example power distribution network for a memory system.

FIG. 2 illustrates a second example power distribution network 200 for a memory system. In one example, a primary power supply 205 (not shown) provides a primary voltage to three secondary power supplies: a retention power supply 210, a transition power supply 220, and an operational power supply 230. In one example, the primary power supply 205 is a voltage regulator. In one example, each of the retention power supply 210, the transition power supply 220 and the operational power supply 230 is a separate voltage regulator.

For example, the retention power supply 210 provides a retention voltage 211 on a retention power bus 212. For example, the transition power supply 220 provides a transition voltage 221 on a transition power bus 222. For example, the operational power supply 230 provides an operational voltage 231 on an operational power bus 232. In one example, the power distribution network 200 includes connections from each power supply 210, 220, 230 to a comparator 250 via a switch subsystem 219.

Also shown in FIG.2 is the switch subsystem 219 including three switches: a retention switch 213, a transition switch 223 and an operational switch 233. The output of the switch subsystem 219 connects to a load input bus 241 and a control input bus 251. In one example, the load input bus 241 supplies a voltage across an electronic load (i.e., load voltage 242). For example, the retention switch 213 may be engaged (i.e., closed) to connect the retention power bus 212 to the load input bus 241 and the control input bus 251. For example, the transition switch 223 may be engaged (i.e., closed) to connect the transition power bus 222 to the load input bus 241 and the control input bus 251. For example, the operational switch 233 may be engaged (i.e., closed) to connect the operational power bus 232 to the load input bus 241 and the control input bus 251. Each of the switches 213, 223, and 233 can be implemented using one or more field effect transistors (FETs), like pFET's and/or nFET's. In one example, the switch subsystem 219 may include a different switch architecture (e.g., a different quantity of switches) but with the same functionality as described herein.

In one example, the electronic load is connected to the retention power bus 212, the transition power bus 222, or the operational power bus 232 via the switch subsystem 219 to the load input bus 241. For example, the electronic load may include a memory unit 240 connected to the load input bus 241. The electronic load may also include other memory units (not shown) connected to the load input bus 241. In one example, the switch subsystem 219 may connect the load input bus 241 to the retention power bus 212, the transition power bus 222, or the operational power bus 232. For example, the operational power bus 232 may be selected when the memory unit 240 is in the operational memory state, the retention power bus 212 may be selected when the memory unit 240 is in the retention memory state and the transition power bus 222 may be selected when the memory unit 240 is in the transition memory state.

In one example, the electronic load is at least one of the following: a memory unit, a processor, a combinational logic, a dynamic logic, or a sequential logic. In one example, the dynamic logic is a combinational logic wherein one portion of the combinational logic is pre-charged to certain voltages and another portion of the combinational logic is actively used to implement various logical functions.

In general, the memory unit 240 operates at a higher voltage level in the operational memory state than in the retention memory state. In one example, the operational memory state is used when the memory unit 240 is in a fully operational memory state. In one example, the retention memory state is used when the memory unit is in a state where there are no accesses to the memory unit, also known as a sleep memory state, but data and logic information stored in the memory unit needs to be retained. In another example, the retention memory state is a low power memory state. For instance, the memory unit 240 can consume less power in the retention memory state than in the operational memory state. In one example, the transition memory state is used when the memory unit 240 is transitioning from the retention memory state to the operational memory state.

Also shown in FIG. 2 is a control circuit 290 connected to the retention power bus 212, the transition power bus 222, or the operational power bus 232 via the switch subsystem 219 and the control input bus 251. For example, the control circuit 290 is a memory controller which manages the memory state for each memory unit. In one example, the control circuit 290 includes the control input bus 251 as its input and provides two control output signals: a transition control signal 273 and an operational control signal 263. For example, the transition control signal 273 controls the transition switch 223 and the operational control signal 263 controls the operational switch 233. For example, when the transition control signal 273 is at a HIGH level, the transition switch is engaged (i.e., closed) to connect the transition power bus 222 to the load input bus 241 and the control input bus 251. For example, when the operational control signal 263 is at a HIGH level, the operational switch 233 is engaged (i.e., closed) to connect the operational power bus 232 to the load input bus 241 and the control input bus 251. In one example, the control circuit 290 manages the transition control signal 273 and the operational control signal 263 based on a comparison between a voltage level of the control input bus 251 and a reference voltage ($V_{REF}$) 252. In one example, the control input bus 251 may serve as a surrogate for the load input bus 241 for the control circuit 290.

In one example, the control input bus 251 serves as a first input to a comparator 250. In one example, the reference voltage ($V_{REF}$) 252 serves as a second input to the comparator 250. In one example, the comparator 250 has a comparator output 253 which has two output states, LOW and HIGH, which depend on a relationship between the first input and the second input. For example, the comparator 250 operates as a threshold device whereby if the first input (i.e., the control input bus 251) has a voltage level lower than the second input (i.e., the reference voltage ($V_{REF}$) 252), then the comparator output 253 is set to a LOW state. For example, if the first input (i.e., the control input bus 251) has a voltage level higher than the second input (i.e., the reference voltage ($V_{REF}$) 252), then the comparator output 253 is set to a HIGH state.

For example, the comparator output 253 is connected to a first input 261 of a flip flop 260. In one example, a second input 262 of the flip flop 260 is set to a HIGH level. In one example, a flip flop output 264 is set to the HIGH level when the first input 261 (i.e., the comparator output 253) transitions from the LOW state to the HIGH state. For example, the flip flop output 264 provides the operational control signal 263 which controls the operational switch 233. That is, in one example, when the operational control signal 263 is at the HIGH level, the operational switch 233 is engaged (i.e., closed) to connect the operational power bus 232 to the load input bus 241 and the control input bus 251.

In one example, an AND gate output 274 of an AND gate 277 is set to the HIGH level when either the operational control signal 263 is set to a LOW level or a retention control signal 272 is set to a LOW level. For example, the operational control signal 263 is inputted to an input 271 to a first inverter 275 and the retention control signal 272 is inputted to an input 278 to a second inverter 276. In one example, an output 281 of the first inverter 275 and an output 282 of the second inverter 276 serve as inputs to the AND gate 277.

In another example, when a transition control signal 273 is at the HIGH level, the transition switch 223 is engaged (i.e., closed) to connect the transition power bus 222 to the load input bus 241 and the control input bus 251.

Figure 3:
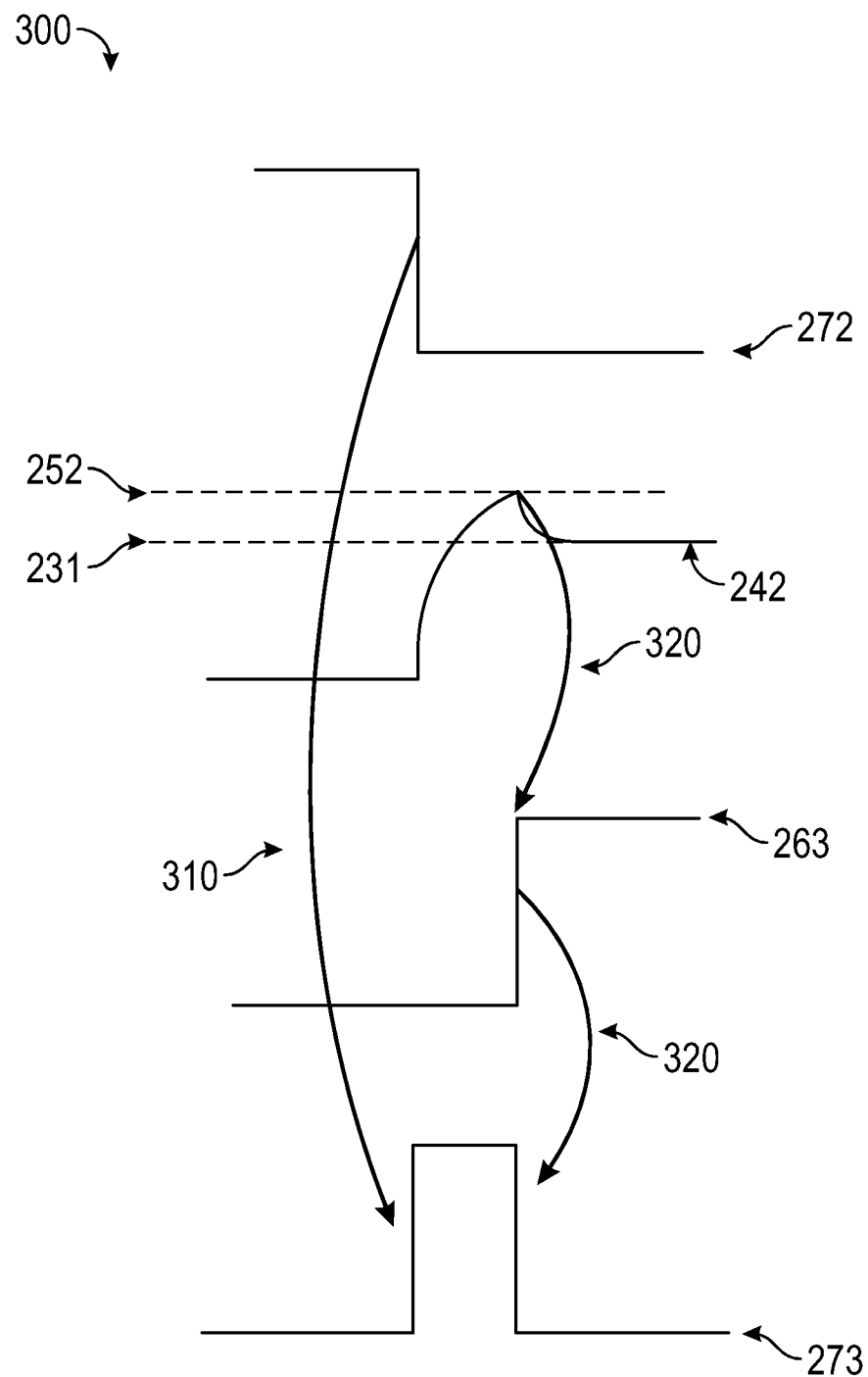
FIG. 3 illustrates an example of timing diagrams of a retention control signal, a transition control signal and an operational control signal.

FIG. 3 illustrates an example 300 of timing diagrams of the retention control signal 272, the transition control signal 273 and the operational control signal 263. For example, at a first timing event 310, the retention control signal 272 first transitions from a HIGH level to a LOW level and the transition control signal 273 transitions from a LOW level to a HIGH level. In one example, the first timing event 310 results in the retention switch 213 being disengaged (i.e., opened) and in the transition switch 223 being engaged (i.e., closed). That is, at the first timing event 310, the memory unit 240 transitions from a retention memory state to a transition memory state.

Also shown in FIG. 3 is the load voltage 242 associated with the load input bus 241. For example, after the first timing event 310, the load voltage 242 increases from a level of the retention voltage 211 beyond a level of the operational voltage 231. In one example, at a second timing event 320, the load voltage 242 exceeds the reference voltage ($V_{REF}$) 252. For example, at the second timing event 320, the transition control signal 273 transitions from a HIGH level to a LOW level and the operational control signal 263 transitions from a LOW level to a HIGH level. In one example, the second timing event 320 results in the transition switch 223 being disengaged (i.e., opened) and in the operational switch 233 being engaged (i.e., closed). That is, at the second timing event 320, the memory unit 240 transitions from the transition memory state to an operational memory state. Moreover, for example, the load voltage 242 transitions from the voltage level of the reference voltage ($V_{REF}$) 252 to the level of the operational voltage 231.

In one example, the power distribution network 200 illustrated in FIG. 2 ensures that DC current is being pumped into the operational power bus 232 without voltage drooping, when the memory unit 240 transitions from the retention memory state to the transition memory state prior to transitioning to the operational memory state, In one example, the transition power supply 220 may be supplied externally with a separate power supply, for example, an external low dropout (LDO) power supply (e.g., provided by another board vendor). In one example, the power distribution network 200 includes additional logic circuitry to ensure that the load voltage 242 associated with the load input bus 241 does not exceed a memory reliability threshold.

In one example, the power distribution network 200 has to support current steps of 40 mA, rather than 170 mA if an example wider bandwidth power distribution network were used. In one example, the power distribution network 200 operates with as little as 30 microamps of static current instead of 100 microamps if instead the example wider bandwidth power distribution network were used.

Figure 4:
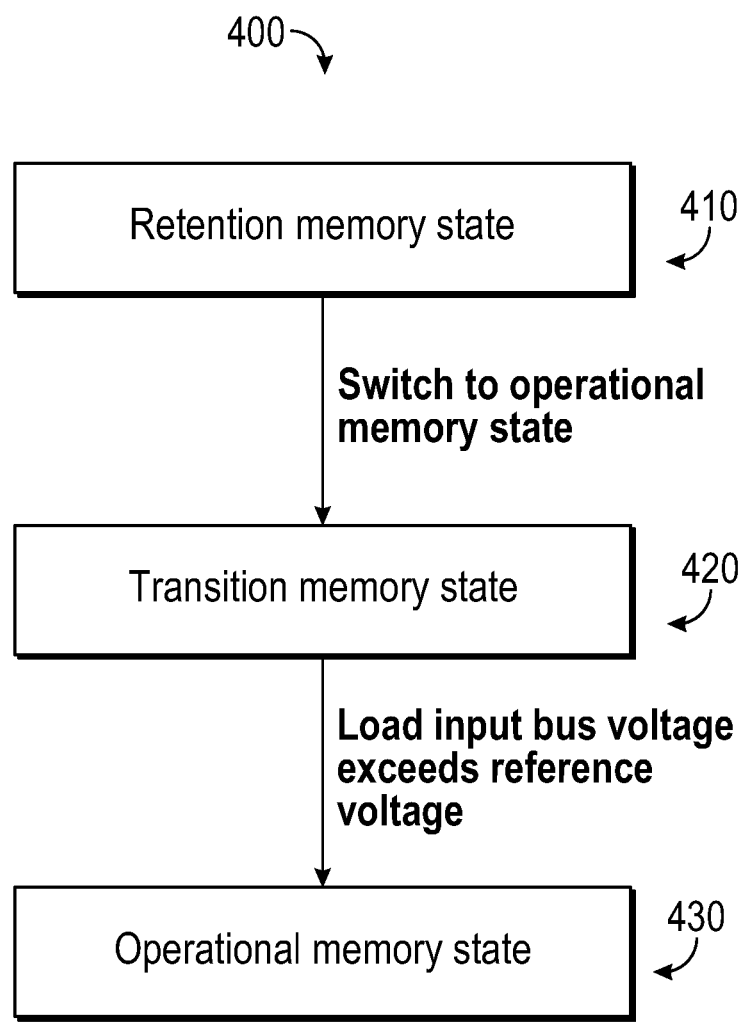
FIG. 4 illustrates an example state transition diagram of the power distribution network illustrated in FIG. 2 for a memory unit.

FIG. 4 illustrates an example state transition diagram 400 of the power distribution network 200 illustrated in FIG. 2 for a memory unit. For example, a retention memory state 410 is a first state. For example, a transition memory state 420 is a second state. For example, an operational memory state 430 is a third state. In one example, the memory unit transitions from the retention memory state 410 to the transition memory state 420 to reduce a power supply voltage transient when switching to the operational memory state 430. In one example, the memory unit transitions from the transition memory state 420 to the operational memory state 430 when the load voltage 242 exceeds the reference voltage ($V_{REF}$) 252, wherein the reference voltage ($V_{REF}$) 252 is greater than the operational voltage 231.

FIG. 5 illustrates an example flow diagram 500 for power supply mode switching. In block 510, an electronic load is supplied power with a first voltage. In one example, the electronic load is a memory unit 240. In one example, the electronic load is a plurality of memory units. In one example, each of the plurality of memory units has a memory state which is independent of the memory state of another of the plurality of memory units. In one example, the memory state is a retention memory state, a transition memory state or an operational memory state.

In one example, the first voltage is a retention voltage. In one example, the first voltage is used for a retention memory state. In one example, while supplying power with the first voltage (i.e., in the retention memory state), a switch subsystem connects a load input bus to a retention power bus with the first voltage. In one example, the retention memory state is attained when the retention control signal is set to a HIGH level and the retention switch is engaged. In one example, the memory unit is in a sleep memory state while supplying power with a first voltage (i.e., in the retention memory state). In one example, while supplying power with a first voltage (i.e., in the retention memory state), there are no accesses to the memory unit, but data and logic information stored in the memory unit is retained.

In block 520, the electronic load is switched to a second voltage. In one example, the second voltage is a transition voltage. In one example, switching to the second voltage terminates the retention memory state and enters the transition memory state. In one example, the transition memory state is an intermediate memory state between the retention memory state and the operational memory state. In one example, while switching to the second voltage (i.e., entering the transition memory state), the switch subsystem connects the load input bus to a transition power bus. In one example, the transition memory state is attained when the transition control signal is set to a HIGH level and the transition switch is enabled (i.e., closed). In one example, the first voltage is less than the second voltage. In one example, the switching to the second voltage is triggered by a change of the memory state of at least one of the plurality of memory units. In one example, the switching to the second voltage is triggered by a transition of the memory state of the electronic load.

In block 530, the electronic load maintains coupling with the second voltage while a voltage across the electronic load (i.e., load voltage) is less than a reference voltage. In one example, the second voltage is the transition voltage. In one example, maintaining coupling of the electronic load with the second voltage maintains the transition memory state until the voltage across the electronic load (i.e., load voltage) exceeds the reference voltage. In one example, a control input bus is used as a surrogate for a load input bus for the voltage across the electronic load (i.e., load voltage). In one example, the reference voltage is greater than an operational voltage. In one example, the electronic load is supplied power with the second voltage while the voltage across the electronic load (i.e., load voltage) is increasing and is less than the reference voltage. In one example, while supplying power with the second voltage, the voltage across the electronic load is non-monotonic. That is, the voltage across the electronic load may be increasing and decreasing, over different time intervals, while supplying power with the second voltage.

In block 540, the electronic load is switched to a third voltage when the voltage across the electronic load is greater than or equal to the reference voltage and the third voltage is less than the second voltage. In one example, the voltage across the electronic load is the voltage across the electronic load (i.e., load voltage). In one example, the third voltage is the operational voltage. In one example, the third voltage is used for the operational memory state. In one example, the first voltage is less than the third voltage and less than the reference voltage. In one example, switching to the third voltage terminates the transition memory state and enters the operational memory state when the voltage across the electronic load (i.e., load voltage) exceeds the reference voltage. In one example, the control input bus is used as a surrogate for the load input bus.

In one example, in the operational memory state, the switch subsystem connects the load input bus to an operational power bus. In one example, the operational memory state is attained when an operational control signal is set to a HIGH level and an operational switch is engaged. In one example, the memory unit is in a fully operational memory state while in the operational memory state. In one example, a common power supply supplies the first voltage and the third voltage. In one example, the common power supply does not supply the second voltage. In one example, the common power supply supplies the second voltage. In one example, the memory state transitions from the retention memory state to the operational memory state.

In one aspect, one or more of the steps for power supply mode switching in FIG. 5 may be executed by one or more processors which may include hardware, software, firmware, etc. In one aspect, one or more of the steps in FIG. 5 may be executed by one or more processors which may include hardware, software, firmware, etc. The one or more processors, for example, may be used to execute software or firmware needed to perform the steps in the flow diagram of FIG. 5. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for power supply mode switching. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. An apparatus for power supply mode switching comprising:
   a first voltage regulator configured to output a first voltage;
   a second voltage regulator configured to output a second voltage;
   a third voltage regulator configured to output a third voltage;
   an electronic load;
   a first switch between the first voltage regulator and the electronic load;
   a second switch between the second voltage regulator and the electronic load;
   a third switch between the third voltage regulator and the electronic load;
   and wherein the first switch, the second switch and the third switch are configured to transition the electronic load from a retention memory state to a transition memory state to an operational memory state.

2. The apparatus of claim 1, wherein the second switch is configured to electrically couple the second voltage regulator to the electronic load when a voltage across the electronic load is less than a reference voltage.

3. The apparatus of claim 2, wherein the second switch is configured to electrically couple the second voltage regulator to the electronic load when the first switch is configured to electrically decouple from the electronic load.

4. The apparatus of claim 3, wherein the third switch is configured to electrically couple the third voltage regulator to the electronic load when the voltage across the electronic load is greater than or equal to the reference voltage.

5. The apparatus of claim 4, wherein the third switch is configured to electrically couple the third voltage regulator to the electronic load when the second switch is configured to electrically decouple from the electronic load.

6. The apparatus of claim 1, wherein the first voltage is less than the second voltage.

7. The apparatus of claim 1, wherein the first voltage is less than the third voltage and less than a reference voltage.

8. The apparatus of claim 1, wherein the first voltage regulator and the third voltage regulator are supplied by a common power source.

9. The apparatus of claim 1, wherein the first voltage regulator and the third voltage regulator are supplied by a first power source different than a second power source supplying the second voltage regulator.

10. The apparatus of claim 1, wherein the electronic load comprises a plurality of memory units.

11. The apparatus of claim 10, wherein a memory state of each of the plurality of memory units is independent of the memory state of another of the plurality of memory units.

12. The apparatus of claim 11, wherein the memory state includes at the retention memory state and the operational memory state.

13. The apparatus of claim 12, wherein the first voltage is used for the retention memory state and the third voltage is used for the operational memory state.

14. The apparatus of claim 1, wherein the first voltage is used for the retention memory state and the third voltage is used for the operational memory state of the electronic load.

15. The apparatus of claim 1, further comprising a logic circuit configured to electrically couple to the electronic load and to the first voltage regulator when the first switch is enabled, configured to electrically couple to the second voltage regulator when the second switch is enabled, or configured to electrically couple to the third voltage regulator when the third switch is enabled.

16. The apparatus of claim 1, wherein the electronic load is at least one of the following: a memory unit, a processor, a combinational logic, a dynamic logic, or a sequential logic.

17. An apparatus for power supply mode switching comprising:
   a first voltage regulator configured to output a first voltage;
   a second voltage regulator configured to output a second voltage;

a third voltage regulator configured to output a third voltage;

an electronic load;

a first switch between the first voltage regulator and the electronic load;

a second switch between the second voltage regulator and the electronic load;

a third switch between the third voltage regulator and the electronic load; and a logic circuit configured to electrically couple to the electronic load and to the first voltage regulator when the first switch is enabled, configured to electrically couple to the second voltage regulator when the second switch is enabled, or configured to electrically couple to the third voltage regulator when the third switch is enabled, wherein the logic circuit comprises:

a comparator; and a flip flop coupled to the comparator.

18. The apparatus of claim 17, wherein the logic circuit further comprises a combinational logic circuit.

19. The apparatus of claim 18, wherein the combinational logic circuit comprises:

a first inverter and a second inverter; and an AND gate with a first input and a second input, wherein the first input is coupled to the first inverter and the second input is coupled to the second inverter.

20. A method for power supply mode switching, comprising supplying power to configure an electronic load to a retention memory state with a first voltage;

switching to a second voltage to configure the electronic load to a transition memory state;

maintaining coupling of the electronic load with the second voltage while a voltage across the electronic load is less than a reference voltage; and switching to a third voltage when the voltage across the electronic load is greater than or equal to the reference voltage and wherein the third voltage is less than the second voltage to configure the electronic load to an operational memory state.

21. The method of claim 20, wherein the switching to the second voltage occurs when the electronic load starts its transition from the retention memory state to the transition memory state.

22. The method of claim 21, further comprising supplying power to the electronic load with the second voltage while the voltage across the electronic load is increasing and is less than the reference voltage.

23. The method of claim 21, further comprising supplying power to the electronic load with the second voltage while the voltage across the electronic load is less than the reference voltage.

24. The method of claim 20, wherein the first voltage is less than the second voltage.

25. The method of claim 20, wherein the first voltage is less than the third voltage and less than the reference voltage.

26. The method of claim 25, wherein the first voltage is used for a retention memory state of the electronic load and the third voltage is used for an operational memory state of the electronic load.

27. The method of claim 20, wherein the first voltage and the third voltage are supplied by a power supply.

28. The method of claim 27, wherein the power supply does not supply the second voltage.

29. The method of claim 27, wherein the power supply supplies the second voltage.

30. The method of claim 20, wherein the electronic load comprises a plurality of memory units.

31. The method of claim 30, wherein a memory state of each of the plurality of memory units is independent of the memory state of another of the plurality of memory units.

32. The method of claim 31, wherein the memory state is a retention memory state or an operational memory state.

33. The method of claim 32, wherein the switching to the second voltage is triggered by a change of the memory state of at least one of the plurality of memory units.

34. The method of claim 20, wherein the switching to the second voltage is triggered by a transition of a memory state of the electronic load.

35. The method of claim 34, wherein the memory state transitions from a retention memory state to an operational memory state.

36. An apparatus for power supply mode switching, comprising means for supplying power to configure an electronic load to a retention memory state with a first voltage;

means for switching to a second voltage to configure the electronic load to a transition memory state;

means for maintaining coupling of the electronic load with the second voltage while a voltage across the electronic load is less than a reference voltage; and means for switching to a third voltage when the-voltage across the electronic load is greater than or equal to the reference voltage and wherein the third voltage is less than the second voltage to configure the electronic load to an operational memory state.

37. The apparatus of claim 36, wherein the first voltage is less than the second voltage, and wherein the first voltage is less than the third voltage and less than the reference voltage.

* * * * *